United States Patent [19]

Reeder

[11] 3,743,748

[45] July 3, 1973

[54] DEVICE FOR TERMINATING A SHIELDED CABLE TO A PRINTED CIRCUIT BOARD AND METHOD OF CONNECTING A SHIELDED CABLE TO A PRINTED CIRCUIT BOARD UTILIZING THE SAME

[75] Inventor: Larry R. Reeder, San Jose, Calif.

[73] Assignee: Raychem Corporation, Menlo Park, Calif.

[22] Filed: Feb. 2, 1972

[21] Appl. No.: 222,806

[52] U.S. Cl. .................... 174/75 C, 29/626, 29/628, 174/68.5, 174/DIG. 8, 339/17 R, 339/177 E, 339/275 B, 339/275 T

[51] Int. Cl. ....... H01r 17/18, H01r 5/04, H05k 3/34

[58] Field of Search ............... 174/68.5, 71 C, 75 C, 174/88 C, DIG. 8; 29/626, 628, 629, 630 R, 630 A; 339/17 R, 31 M, 126 J, 177 R, 177 E, 275 B, 275 T, 276 T

[56] References Cited

UNITED STATES PATENTS

| | | | |
|---|---|---|---|
| 2,214,065 | 9/1940 | Pennock et al. | 339/31 M |
| 3,359,360 | 12/1967 | Owings | 174/52 PE |
| 3,383,457 | 5/1968 | Schumacher et al. | 174/68.5 |
| 3,467,941 | 9/1969 | Martin | 339/31 M |
| 3,541,495 | 11/1970 | Ellis et al. | 174/75 C X |

*Primary Examiner*—Laramie E. Askin
*Attorney*—Charles G. Lyon et al.

[57] ABSTRACT

A terminating device is disclosed which is useful for electrically connecting a shielded cable to a printed circuit board or other conductive member. The device has a shaped, conductive clip having at its first end a first connector for connection to the shield of a coaxial cable. The other end of the clip has a connector for electrical connection to the center conductor of the coaxial cable. A leg protrudes downwardly near each end and the two ends are temporarily connected by a removable tab. Heat shrinkable sleeves with solder inserts may be advantageously attached to this clip to help secure the connections between the cable and the clip and to help prevent undesired electrical contact.

10 Claims, 7 Drawing Figures

DEVICE FOR TERMINATING A SHIELDED CABLE TO A PRINTED CIRCUIT BOARD AND METHOD OF CONNECTING A SHIELDED CABLE TO A PRINTED CIRCUIT BOARD UTILIZING THE SAME

BACKGROUND OF THE INVENTION

The field of the invention is electrical terminating devices and more particularly relates to those devices useful for forming electrical connections between shielded conductors and printed circuit boards. Many ways are known to electrically connect shielded conductors such as coaxial cables to printed circuit boards. One such means is the simple unraveling and then regathering of a short length of an outer shield, inserting its end through a hole in a printed circuit board and soldering it to one portion of the circuit board and inserting, bending and soldering the center conductor to another hole in the circuit board. This method, although simple, has several shortcomings. First, the inserted wire often pulls out of the hole before it can be secured by solder. Also, this method can result in an excess of bared shield or conductor above or below the printed circuit board. When the connection is made to a double-sided board, the protrusion of the conductor through the board can cause a puncture in a cable on the reverse side of the board. Connecting jacks have been soldered on to the ends of conductors and these jacks have been shaped for insertion into holes in printed circuit boards. The attachment of such jacks requires the unbraiding and regathering of a shield portion of the cable. Furthermore, connection to such jacks is often difficult because of the diminutive size of the jacks.

The use of heat recoverable sleeves for protecting electrical connections is well known. The use of solder inserts with heat recoverable sleeves has also become well known and such devices are shown in Wetmore U. S. Pat. No. 3,243,211, the disclosure of which is incorporated by reference herein.

SUMMARY OF THE INVENTION

It is an object of the present invention to provide a compact terminating device for electrically connecting a shielded cable to a printed circuit board.

According to the present invention there is provided a terminating device in the form of a clip having two or more sections joined by a removable tab. Each section is adapted for connection to separate conductors and each section is also adapted for connection to different portions of a printed circuit board. After the clip has been connected at each section both to the separate conductors and to the printed circuit board, the removable tab which has functioned to hold together and position the section during the connecting steps is removed. The result is the individual termination of several conductors to different portions of a printed circuit board.

The clip may be shaped to facilitate its connection to a coaxial cable. A preferred embodiment of the terminating device of the present invention has one or more heat recoverable sleeves attached thereto. These sleeves may be made of insulative polymer to which the property of heat recoverability has been imparted. These sleeves may be provided with solder inserts or the clip sections may be coated with solder. When both sections of the device are so equipped, a stripped coaxial cable may be simply inserted through each heat recoverable sleeve and the sleeves reheated to cause a shrinking of the sleeve and a melting of the solder thereby providing an insulated, physically strong and electrically conductive attachment to both the cable shield and the center conductor.

The removable tab of the present invention may be removed in several ways such as by the provision of a notched, weakened area whereby the tab may be bent back and forth several times and broken off at the notched, weakened area. The clip may be attached to the holes in a printed circuit board by legs which may be provided with barbs or otherwise shaped so as to form a friction-tight fit with the holes.

DESCRIPTION OF THE PREFERRED EMBODIMENTS

Figure 1:
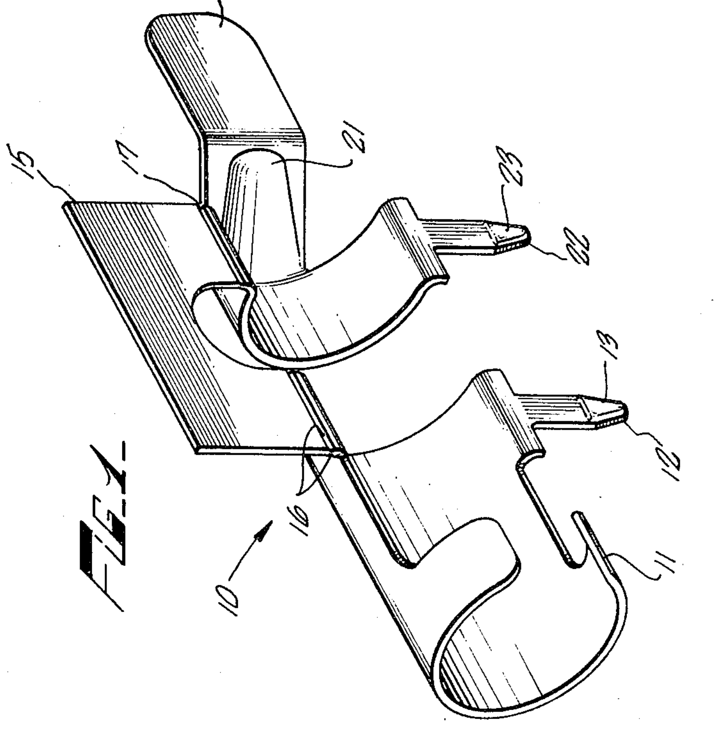
FIG. 1 is a perspective view of the conductive clip of the present invention.

As shown in FIG. 1, a conductive clip 10 is shown in perspective view. Clip 10 is preferably fabricated from a conductive material to which an electrical connection may readily be made. For instance, it is advantageous that the clip be easily solderable or alternatively be readily crimped. A preferred material of construction is tin-plated brass.

Clip 10 has a first end 11 at its first end. First end 11 is shown in the drawings as a semi-cylinder but instead could be a rectangular channel or even a flat, open bar. First end 11 forms a base to which the shield of a stripped coaxial cable may be electrically connected. Since the clip 10 may cooperate with an insulative heat recoverable sleeve, the shape of first end 11 may take on numerous configurations as long as it presents a sufficient conductive surface for electrical connection to the shield. Furthermore, first end 11 could be in the shape of a crimpable connector whereby the electrical connection is not made by soldering but instead by a physical bending or crimping of the end against the outer surface of the bared, shield portion of a coaxial cable. The crimped connector could either be integral with the conductive clip or could comprise a soldered or welded crimp connector attached to end 11. Still further, the conductors may be welded to the first end rather than crimped or soldered.

A first leg 12 is attached to first end 11 and is shaped to fit into a hole in a printed circuit board. The device of the present invention could, of course, be attached to an electrical device other than a printed circuit board. When so used, leg 12 should be shaped to accommodate that other device. It is desirable that leg 12 form a friction-tight fit onto the device to which it will be connected. One such means of accomplishing this is the provision of a protrusion 13 on leg 12 which extends outwardly from the leg to an extent sufficient to bind against the edge of a hole in a printed circuit board. In this way, the device may have considerable structural integrity even before the leg 12 is soldered to the printed circuit board. Another way of providing a friction-tight fit is by the separation of adjacent legs a distance slightly different than the separation of the holes. In this way, the legs are somewhat sprung apart or together when they are inserted into adjacent holes to form a friction-tight fit.

The first section of the conductive clip is attached to the second section of the conductive clip through a removable tab 15. The function of this tab is to physically connect the two ends of the clip together while the clip is attached to several conductors and to a printed circuit board. After this connection has been completed, the tab 15 is removed. There are numerous ways that tab 15 may be removed. One such way is shown in the drawing where a pair of notches 16 and 17 are formed in the lower ends of tab 15. In this way, tab 15 may be removed by bending it back and forth and breaking it away from the two ends of the clip 10. It is not necessary that notches be provided, however, in that the buss bar may be simply cut away. Alternatively a series of perforations could be utilized in place of a notch. Furthermore, it is not necessary that the notch if used, be parallel to the longitudinal axis of clip 10 but, for instance, a pair of notches perpendicular to the longitudinal axis of clip 10 could be provided in tab 15 to facilitate its removal.

A second end 20 is provided in clip 10. End 20 comprises a strip having a coined indentation 21 which serves to guide the center conductor of a coaxial cable to a position adjacent second end 20. Second end 20 is, of course, connected to first end 11 through removable buss bar 15.

A second terminal leg 22 is integrally connected to second end 20. Like leg 12, leg 22 is adapted to fit into an opening in a printed circuit board. Means are provided to form a friction-tight fit between leg 22 and the opening of the printed circuit board. Such means may include a protrusion 23 having a size sufficient so that it forms a friction-tight fit in the opening. As described above, the two legs could be spaced apart slightly more or less than the distance between the two openings so that a binding fit is provided. This latter means is advantageous in those applications where it is beneficial that the legs do not completely protrude through the printed circuit board. Such protrusion can, in some critical applications, lead to an undesirable electrical contact with members positioned on the opposite side of the printed circuit board from the clip 10.

Figure 2:
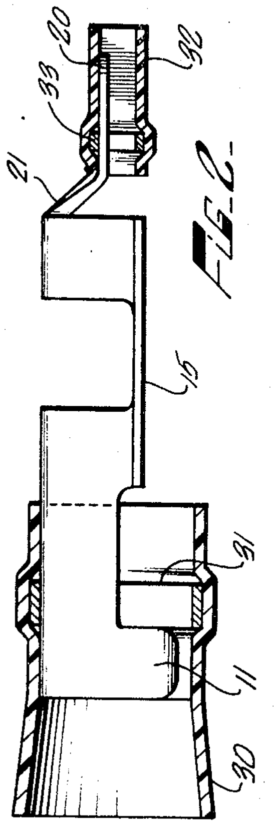
FIG. 2 is a plan view, partly in cross-section of a terminating device made according to the present invention.

The conductive clip of FIG. 1 is shown in plan view in FIG. 2. Heat shrinkable insulating tubing is attached to each end and the tubing is supplied with premeasured fluxed solder in a manner described below. Although the provision of tubing and solder is a preferred embodiment of the present invention, the conductive clip of FIG. 1 may be used without these members and a stripped coaxial cable may be directly soldered to clip 10 in a conventional manner.

As shown in FIG. 2, first end 11 has a short length of heat shrinkable insulating tube 30 adhered to it. Means for forming heat recoverable tubing and specifically heat shrinkable tubing are well known and several U.S. Pats. describing methods of imparting this property include Nos. 2,027,962 3,086,242 and 3,243,211 the disclosurers of which are incorporated herein by reference. A ring of premeasured, fluxed solder 31 is provided in the interior of tube 30. The provision of fusible inserts within heat recoverable tubes is disclosed in Wetmore U.S. Pat. No. 3,243,211. Solder 31 has a melting point such that upon the heating of tube 30 to its heat recovery temperature, solder 31 melts and is capable of flowing between first end 11 and an inserted, stripped coaxial cable shield.

Similarly, the second end 20 is surrounded by a heat shrinkable insulating tube 32. Tube 32 is rectangular in cross-section and contains a short length of fluxed solder 33 which functions in a manner similar to solder 31 and provides electrical contact between the stripped center conductor of a coaxial cable and the shallow channel or tab which comprises second end 20.

Although the use of a solder ring is a preferred embodiment of the present invention, other means of connecting conductors to clip 10 can be used. For instance the ends may be dipped or plated with solder which has a melting temperature such that it will melt and flow at the temperature used to recover tubes 30 and 32. Furthermore holes can be drilled in ends 11 and 32 and these may be dipped in solder thereby filling the holes with solder and providing a reservoir sufficient to result in an excellent electrical contact. Still further, the electrical connection can be made without the use of solder and conventional crimped connectors can be provided at each end of the conductors may be welded to each end.

Figures 3, 4:
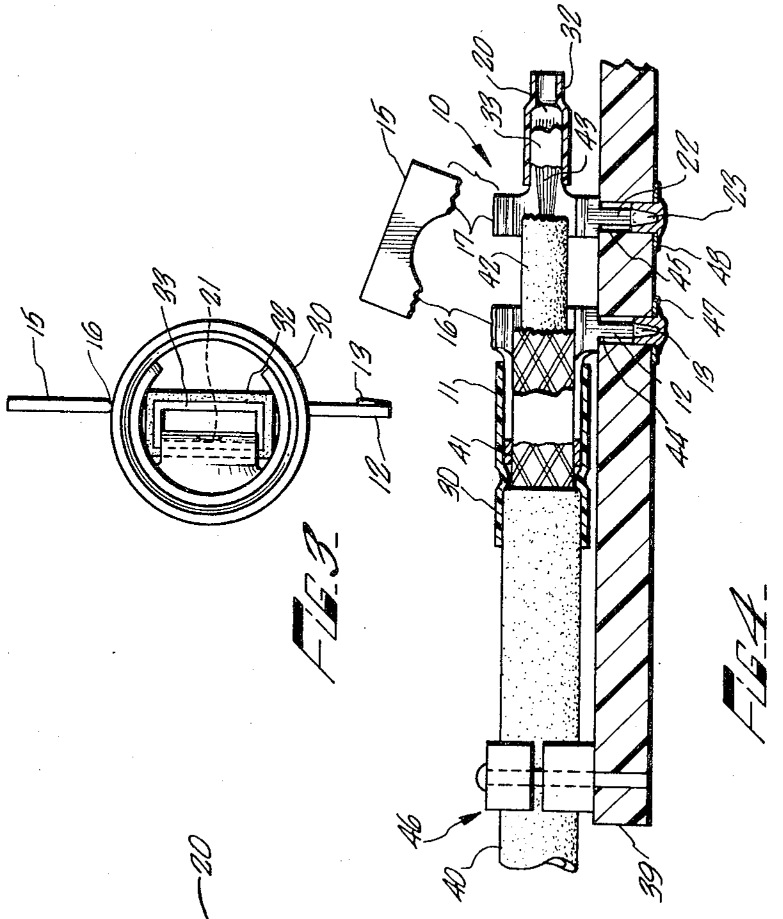
FIG. 3 is an end view of the device of FIG. 2.
FIG. 4 is a side view, partly in cross-section, of the terminating clip of FIG. 1 attached to a coaxial cable and to a printed circuit board.

The device of FIG. 2 is shown in end view in FIG. 3. The shape of the coined indentation 21, solder 33 and tube 32 are more clearly shown in this view. The break-off notch 16 comprising an indentation on each side of removable tab 15 is also shown. A particular shape of protrusion 13 on leg 12 is also shown in this view.

Turning now to FIG. 4, a stripped coaxial cable 40 is shown electrically connected to a printed circuit board 39. Cable 40 has been stripped so as to expose braid 41, center dielectric 42 and center conductor 43.

One method for carrying out this assembly comprises stripping the length of the coaxial cable to a configuration as shown in FIG. 4. Clip 10 with its associated tubes is then placed over the end of the cable, and the shield and center conductor are electrically connected to the clip. This is accomplished by heating heat shrinkable tubes 30 and 32 to cause them to recover against braid 41, and center conductor 43 is soldered to second end 20. The cable is next placed on printed circuit board 39 and legs 12 and 22 are placed in openings 44 and 45 of printed circuit board 39. A strain relief clamp 46 is next installed over cable 40 but the use of such clamps is optional. Legs 12 and 13 are then soldered to the conductive portions 47 and 48 of printed circuit board 39. At this stage of assembly, braid 41 and center conductor 43 are electrically connected through removable tab 15 and thus, in order to complete the installation, it is necessary to remove tab 15 from the remainder of clip 10.

An infrared heater may be used to recover the tubing and to melt the solder. It has been found that when a 500 watt infrared heater was used on a device such as that shown in FIG. 2 having an overall length of 0.90 inch that both shield termination and center conductor termination was completed in 3 to 5 seconds. It has also been found that the soldering of the legs to the printed circuit board does not provide enough heat to cause an undesired melting of the soldered connection between the ends and the coaxial cable conductors.

Figures 5, 6, 7:
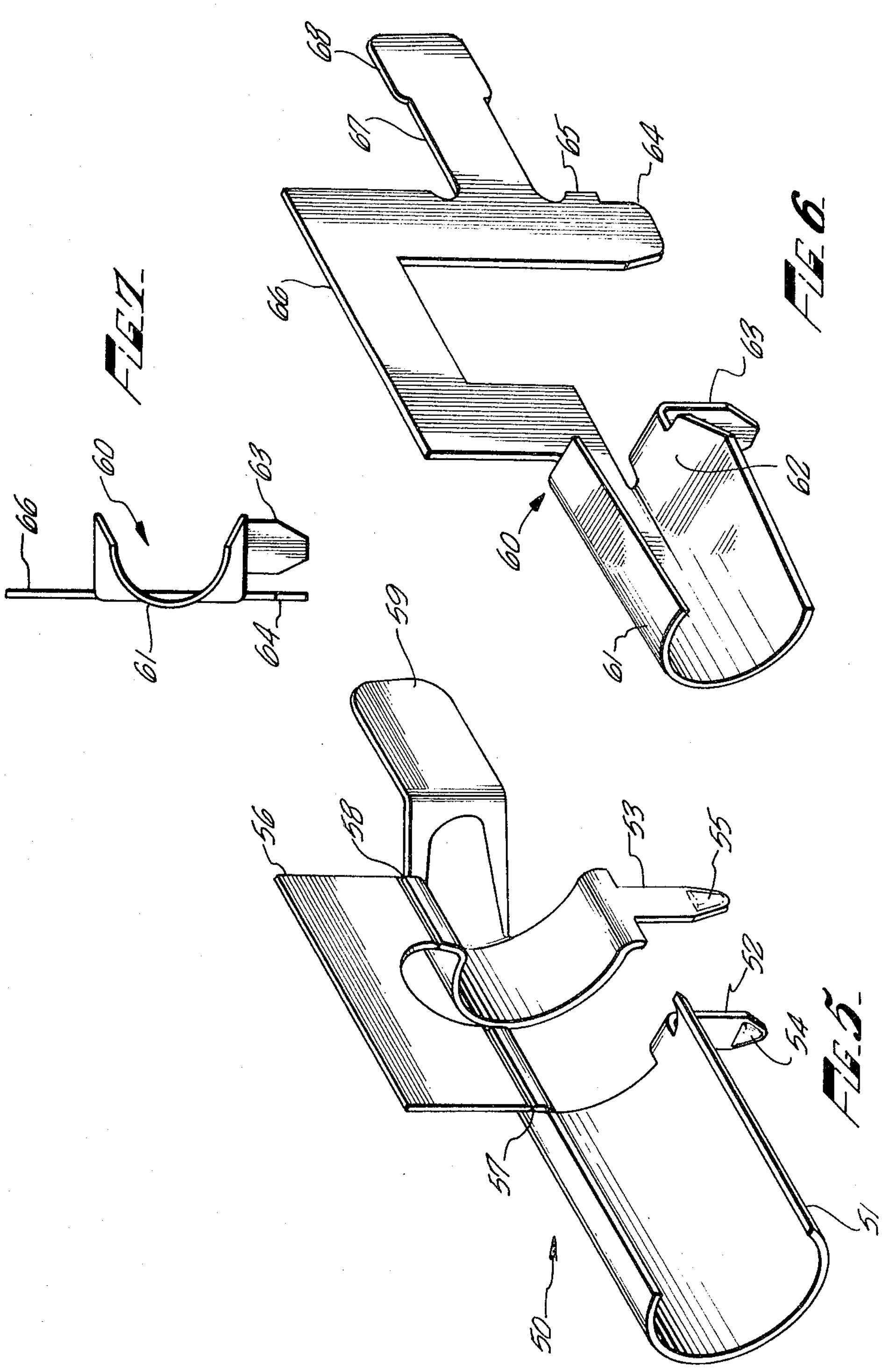
FIG. 5 is a perspective view of an alternate configuration of the conductive clip of the present invention.
FIG. 6 is a perspective view of a further alternate configuration of the conductive clip of the present invention.
FIG. 7 is an end view of the clip of FIG. 6.

An alternate configuration of the clip of the present invention is shown in FIG. 5. The clip 50 has a first channel position 51 and a first leg 52. Unlike leg 12 of the clip of FIG 1, leg 52 is in a plane which is perpendicular to the plane in which the second leg 53 is located. By so positioning leg 52 the clip is more securely held after insertion into the printed circuit board and side-to-side rocking of the clip in the board prior to soldering is reduced. Legs 52 and 53 have protrusions 54 and 55 located thereon and these further secure the clip in the board prior to soldering. A removable tab 56 together with notches 57 and 58 function in a manner similar to that described above for clip 10. Likewise the connection of a conductor to the first channel portion 51 and to the second end 59 is similar to that described for clip 10.

A different embodiment of the present invention is shown in FIGS. 6 and 7. Clip 60 has a first channel portion 61 which is semicylindrical in shape at its end and in the shape of a portion of a rectangle at its inner end. The bottom portion 61 of the rectangle rests against the surface of the printed circuit board and functions to further stabilize the clip prior to its final soldering or other attachment to the printed circuit board. First leg 63 is shaped to fit an opening in a printed circuit board as is second leg 64. Leg 64 has a protrusion 65 which acts as a stop to limit the insertion depth of leg 64 into an opening in a circuit board.

Removable tab 66 is located between the two ends of the clip and may be removed by cutting, sawing or the like. The second end 67 has an enlarged portion 68 that helps to hold or lock a heat shrinkable sleeve over end 67.

The clip of the present invention may be modified to provide termination of a triaxial cable by the provision of a third leg and third end axially aligned with the first two legs and channels. Alternatively, a shielded cable with a plurality of non-axially aligned center conductors may be terminated to a printed circuit board by an adaptation of the present invention. Thus, the present invention is not limited to the termination of a coaxial cable but instead is applicable to wires with more than one conductor and to shielded cables in general.

The devices of the present invention permit high density terminations so that a number of shielded cables may be terminated with multiple devices. Note that when parallel terminations are made that undesirable electrical contact between adjacent devices is prevented by the protrusion of the side of tube 30. Thus, even if one of the connected devices were intentionally bent against an adjacent device, no electrical contact would result since tube 30 is the outermost lateral protrusion of the device of FIGS. 2 through 4. A relatively broad range of coaxial cables sizes may be terminated with the device of the present invention. The device of the present invention has been found useful in terminating low temperature coaxial cables such as those utilizing foamed, nonirradiated polyethylene dielectrics.

The present embodiments of this invention are thus to be considered in all respects illustrative and not restrictive, the scope of the invention being indicated by the appended claims rather than by the foregoing description. All changes which come within the meaning and range of equivalency of the claims therefore are intended to be embraced therein.

I claim:

1. A terminating device for electrically connecting a coaxial cable to a printed circuit board, said device comprising:

a formed conductive clip, said clip having a first end comprising a first means for connection to a stripped shield portion of a coaxial cable, said first end having attachment means for connection to a printed circuit board, a removable tab attached to said first end, a second end attached to said removable tab and comprising means for connection of a center conductor thereto, said second end having attachment means for connection to a printed circuit board.

2. The device of claim 1 wherein at least one of said means for connection is surrounded by a length of heat shrinkable tubing.

3. The device of claim 1 wherein at least one of said means for connection has a quantity of solder attached thereto.

4. The device of claim 1 wherein said first and second means for connection have a quantity of solder attached thereto and are surrounded by a length of heat shrinkable tubing.

5. The device of claim 1 wherein said removable tab has a weakened area to facilitate the removal of said tab from the remainder of said conductive clip.

6. The device of claim 5 wherein said weakened area is a formed notch or notches.

7. The device of claim 1 wherein said means for connection to a stripped shield portion comprise a crimpable channel and said means for connection to a center conductor comprise a crimpable channel.

8. The device of claim 1 wherein said means for connection to a stripped shield portion comprise a weldable channel and said means for connection to a center conductor comprise a weldable channel.

9. The device of claim 1 wherein said attachment means comprises leg means have locking means capable of forming a friction-tight fit with a pair of holes in a printed circuit board.

10. A method for electrically connecting a coaxial cable to a printed circuit board utilizing a conductive clip having a first and a second section joined by a removable tab, each of the sections having leg means electrically connected thereto and a length of heat recoverable tubing attached thereto and a quantity of solder located within each length comprising the steps of:

stripping an end of the coaxial cable to expose a first bared length of shield, a second center length of dielectric insulation and a third length of bared center conductor;

inserting the resulting stripped coaxial cable into the conductive clip;

heating the first and second sections thereby soldering the first bared length of shield to the first section and the third length of bared center conductor to the second section and recovering the length of tubing around the first and second sections;

inserting the legs into holes of the printed circuit board;

soldering the legs to the printed circuit board; and removing the removable tab.

* * * * *